United States Patent
Jun (10) Patent No.: US 7,825,494 B2
(45) Date of Patent: Nov. 2, 2010

(54) IMAGE SENSOR AND METHOD FOR MANUFACTURING THE SAME

(75) Inventor: Sung Ho Jun, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 121 days.

(21) Appl. No.: 12/336,484

(22) Filed: Dec. 16, 2008

(65) Prior Publication Data
US 2009/0159943 A1 Jun. 25, 2009

(30) Foreign Application Priority Data
Dec. 22, 2007 (KR) .................. 10-2007-0135956

(51) Int. Cl.
*H01L 31/00* (2006.01)

(52) U.S. Cl. .................. 257/620; 257/E31.038

(58) Field of Classification Search ........ 257/620, 257/E31.038
See application file for complete search history.

(56) References Cited

U.S. PATENT DOCUMENTS

| 5,698,892 A * | 12/1997 | Koizumi et al. ........ 257/620 |
| 2005/0031995 A1 * | 2/2005 | Kang et al. .............. 430/311 |

* cited by examiner

*Primary Examiner*—Thomas L Dickey
(74) *Attorney, Agent, or Firm*—The Law Offices of Andrew D. Fortney; Andrew D. Fortney (57) ABSTRACT

An image sensor may include a dielectric, a metal interconnection, an align key, a first substrate, a photodiode, and a transparent electrode. The first substrate may include a pixel region, a peripheral circuitry region and a scribe lane. The dielectric may include a metal interconnection and an align key over the first substrate. The photodiode may be formed over the pixel region and the scribe lane. The transparent electrode may be formed over the photodiode. The align key may have a protrusion formed in a center thereof.

20 Claims, 6 Drawing Sheets

IMAGE SENSOR AND METHOD FOR MANUFACTURING THE SAME

The present application claims the benefit under 35 U.S.C. §119 to Korean Patent Application No. 10-2007-0135956 (filed Dec. 22, 2007), which is hereby incorporated by reference in its entirety.

BACKGROUND

A complementary metal oxide silicon (CMOS) image sensor may include a photodiode region for converting an optical signal to an electrical signal, and a transistor region for processing the converted electrical signal, in which the photodiode region and the transistor region are horizontally arranged.

In a horizontal type CMOS image sensor, a photodiode and a transistor are horizontally formed adjacent to each other over a substrate. Therefore, an additional region for forming the photodiode is required, which may decrease the fill factor and limit the possibility of resolution.

SUMMARY

Embodiments of the present invention relate to an image sensor and a manufacturing method thereof.

Embodiments of the present invention relate to an image sensor that may include at least one of the following: a first substrate including a pixel region, a peripheral circuitry region and a scribe lane; a dielectric including a metal interconnection and an align key over the first substrate; a photodiode over the pixel region and the scribe lane; and a transparent electrode over the photodiode, wherein the align key has a protrusion formed in a center thereof.

Embodiments of the present invention also relate to a method for manufacturing an image sensor that may include at least one of the following steps: preparing a first substrate which may include a pixel region, a peripheral circuitry region and a scribe lane; forming a dielectric including a metal interconnection and an align key over the first substrate; forming a photodiode over the pixel region and the scribe lane; and forming a transparent electrode over the photodiode, wherein the align key has a protrusion formed in a center thereof.

DRAWINGS

FIGS. 1 through 9 illustrate an exemplary method for manufacturing an image sensor in accordance with embodiments of the present invention.

DESCRIPTION

An image sensor and a method for manufacturing an image sensor in accordance with embodiments of the present invention will be described in detail with reference to the accompanying drawings.

Figure 9:
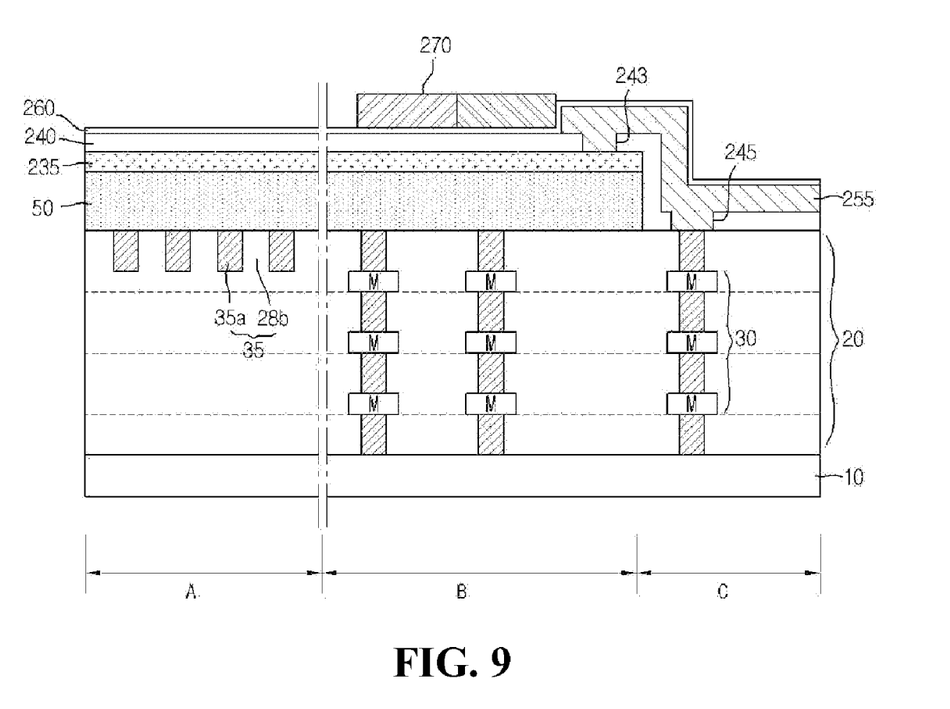

FIG. 9 is a sectional view of an exemplary image sensor in accordance with embodiments of the present invention.

As illustrated in FIG. 9, an image sensor may include: first substrate 10 including a pixel region (B), a peripheral circuitry region (C) and a scribe lane (A); interlayer dielectric 20 including metal interconnection 30 and align key 35 over first substrate 10; photodiode 50 over the pixel region (B) and the scribe lane (A); and transparent electrode 235 over photodiode 50, wherein the align key 35 has protrusion 28b formed at a center thereof.

First substrate 10 may be a single crystalline or polycrystalline silicon substrate doped with a p-type impurity or n-type impurity. Interlayer dielectric 20 over first substrate 10 may include align key 35 and metal interconnection 30. Photodiode 50 may be disposed over first substrate 10. Align key 35 may include protrusions 28b made of interlayer dielectric 20 and align patterns 35a made of buried metal in the scribe lane (A).

Protrusions 28b may be formed between align patterns 35a, thereby enhancing the bonding force between protrusions 28b and photodiode 50. That is, since align patterns 35a may be formed around protrusions 28b, the bonding force between protrusions 28b and photodiode 50 is not decreased.

Photodiode 50 may be formed by doping a single crystalline or polycrystalline silicon substrate with a p-type or n-type impurity. Transparent electrode 235 may be disposed over photodiode 50 and may be electrically connected to photodiode 50.

First passivation layer 240 may have first and second trenches 243 and 245 which may be disposed over first substrate 10 as well as photodiode 50. First and second trenches 243 and 245 may expose transparent electrode 235 and metal interconnection 30, respectively. First passivation layer 240 may comprise an oxide layer or nitride layer.

Upper electrode 255 may be disposed over first passivation layer 240 including first and second trenches 243 and 245. Upper electrode 255 can be formed so as not to cover a portion of photodiode 50 corresponding to a unit pixel. Upper electrode 255 may extend to first and second trenches 243 and 245 to be electrically connected to transparent electrode 235.

Second passivation layer 260 may be disposed over first passivation layer 240 and upper electrode 255. Second passivation layer 260 may comprise an oxide layer or nitride layer. Color filter 270 may be disposed over second passivation layer 260 in a region corresponding to photodiode 50.

An image sensor in accordance with embodiments of the present invention can provide a vertical integration by forming photodiode 50 over metal interconnection 30. Also, an image sensor in accordance with embodiments of the present invention can decrease generation of a defect in the photodiode by forming photodiode 50 in a crystalline semiconductor layer.

A method for manufacturing an image sensor in accordance with embodiments of the present invention will now be described with reference to FIGS. 1 through 9.

Figure 1:
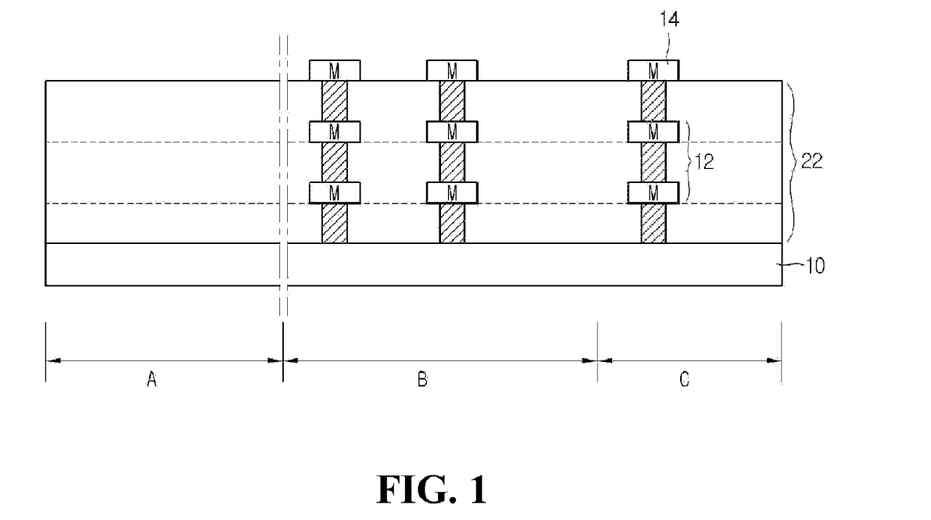

As illustrated in FIG. 1, first dielectric 22 including first metal interconnection 12, and second metal interconnection 14 may be formed over first substrate 10. First substrate 10 may be a single crystalline or polycrystalline silicon substrate doped with a p-type impurity or n-type impurity.

First substrate 10 may include a scribe lane (A), a pixel region (B) and a peripheral circuitry region (C). In the pixel region (B), a transistor circuitry connected to a photodiode to be described later may be formed for each unit pixel so as to convert received photo charges to an electrical signal.

The transistor circuitry may be one of 3Tr, 4Tr or 5Tr circuitries. In the peripheral circuitry region (C), a transistor circuitry for sequentially detecting electrical signals of respective unit pixels to generate an image may be formed.

Second metal interconnection 14 may be formed by forming a first metal layer over first dielectric 22 and patterning the first metal layer. Second metal interconnection 14 may be formed over the pixel region (B) and the peripheral circuitry region (C). Second metal interconnection 14 may be an uppermost metal interconnection positioned at an uppermost part of interlayer dielectric 22, and may comprise a conductive material layer including metal, alloy or salicide, for example, Al, Cu, Co or W.

Figure 2A:
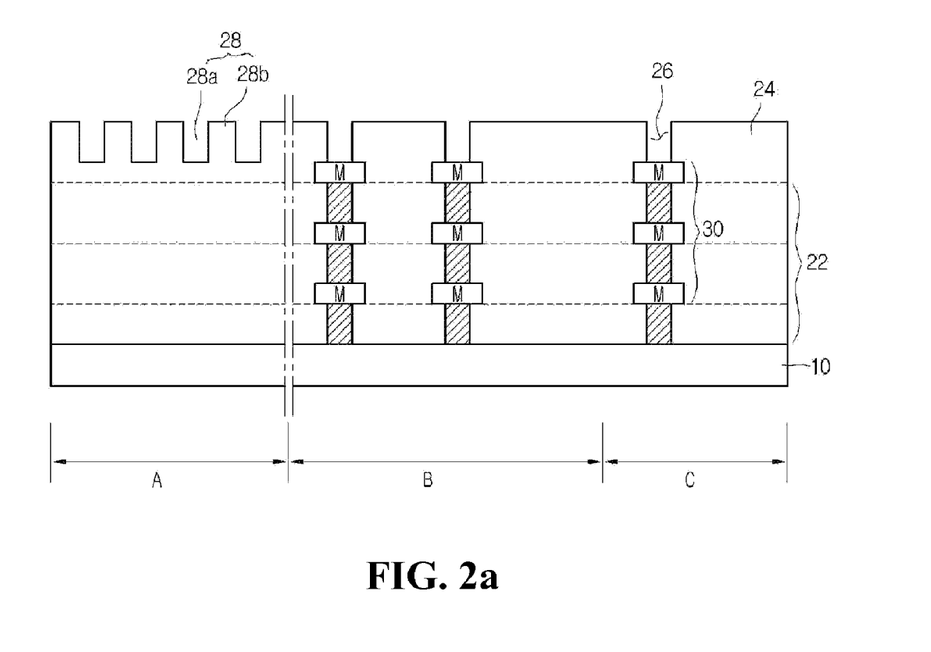

As illustrated in FIG. 2a, second dielectric 24 which may include via hole 26 and align groove 28 may be formed over first dielectric 22 and over second metal interconnection 14. Via hole 26 may be formed in the pixel region (B) and the peripheral circuitry region (C), and the align groove 28 may be formed in the scribe lane (A).

Via hole 26 and align groove 28 may be formed by forming second dielectric 24 over first dielectric 22 and second metal interconnection 14 and then etching second dielectric 24. Via hole 26 may correspond to second metal interconnection 14 in the pixel region (B) and the peripheral circuitry region (C), and align groove 28 may be formed in the scribe lane (A). Protrusion 28b may be made of second dielectric 24 and may be positioned at a center of align groove 28.

Figure 2B:
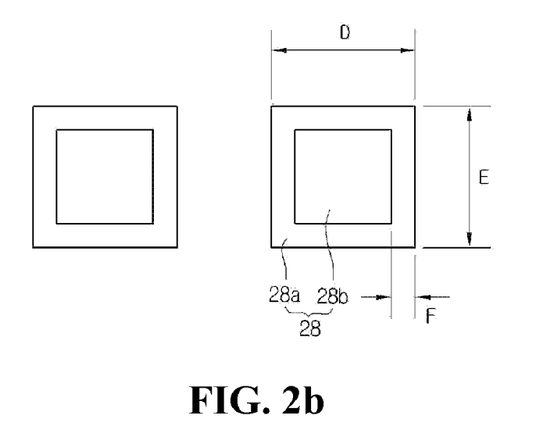

FIG. 2b is a plane view illustrating align groove 28.

As illustrated in FIG. 2b, protrusion 28b may be formed at a center of align groove 28. That is, groove 28a surrounding protrusion 28b may be formed around protrusion 28b. Width (D) and length (E) of align groove 28 may be formed in a range of 2-5 µm. A distance from an edge of align groove 28 to protrusion 28b may be 0.3-0.4 µm. That is, the width (F) of groove 28a may be 0.3-0.4 µm.

While exemplary embodiments of the present invention provide that align groove 28 is a rectangle, align groove 28 may have a shape of a circle or polygon.

Figure 3A:
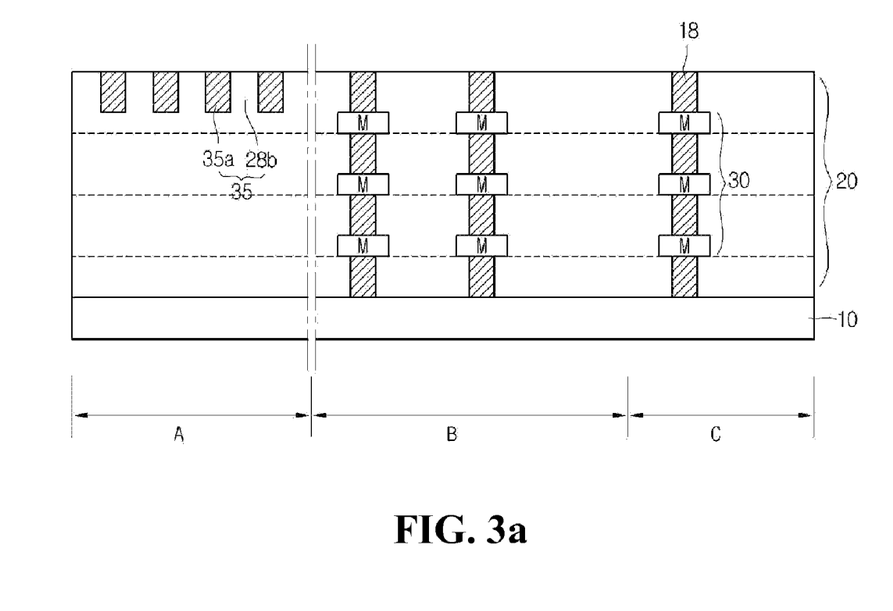

As illustrated in FIG. 3a, a metal may be filled in groove 28a and via hole 26 to form align key 35 and plug 18. That is, plug 18 connected to second metal interconnection 14 may be formed in via hole 26 and align key 35 including align pattern 35a may be formed in the scribe lane (A). Plug 18 and align pattern 35a may be formed by depositing a metal layer over interlayer dielectric 20 including via hole 26 and align groove 28 and planarizing the deposited metal layer.

In the planarizing process, since protrusion 28b made of interlayer dielectric 20 may exist at the center of align key 35, the planarizing process does not cause a dishing phenomenon where protrusion 28b is formed. That is, since groove 28a is formed only around protrusion 28a, a dishing phenomenon is reduced or is not generated. Therefore, although a photodiode may be formed on and/or over align key 35, the bonding force between protrusion 28b and the photodiode is not decreased.

Interlayer dielectric 20 including metal interconnection 30 may be connected to a power line or a signal line, and align key 35 for alignment in each process may be formed over first substrate 10.

Metal interconnection 30 may deliver or transfer electrons generated in the photodiode to an underlying CMOS circuitry. Although not shown in the drawings, metal interconnection 30 may be connected to an impurity-doped region formed at a lower portion of first substrate 10. Metal for filling via hole 26 and align key 35 may comprise tungsten (W).

Plug 18 and align key 35 may be exposed to a surface of interlayer dielectric 20. Since protrusion 28b comprises an insulator at a center of align key 35, protrusion 28b enhances the bonding force to a photodiode to be formed on and/or over interlayer dielectric 20, including align key 35 and metal interconnection 30.

Figure 3B:
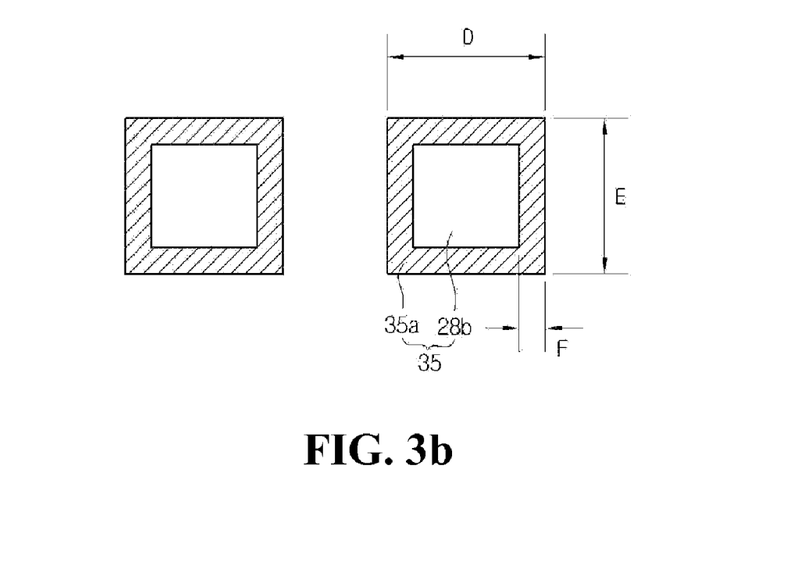

FIG. 3b is a plane view illustrating align key 35.

As illustrated in FIG. 3b, protrusion 28b comprises an insulator at a center of align key 35, and align pattern 35a may surround protrusion 28b. Width (D) and length (E) of align key 35 may be formed in a range of 2-5 µm. A distance from an edge of align key 35 to protrusion 28b may be 0.3-0.4 µm. That is, the width (F) of align pattern 35a may be 0.3-0.4 µm.

Align key 35 may be used to align two wafers (or a plurality of stepper fields on a wafer). The alignment between two wafers (or stepper fields) may be performed in two stages. In a first stage, two wafers (or stepper fields) may be aligned (e.g., with an error of less than 100 µm in the case of two wafers) using a notch of a wafer over or on which devices are formed, and in a second stage, the two wafers (or stepper fields) may be aligned by sensing or detecting align key 35 using a laser.

Figure 4:
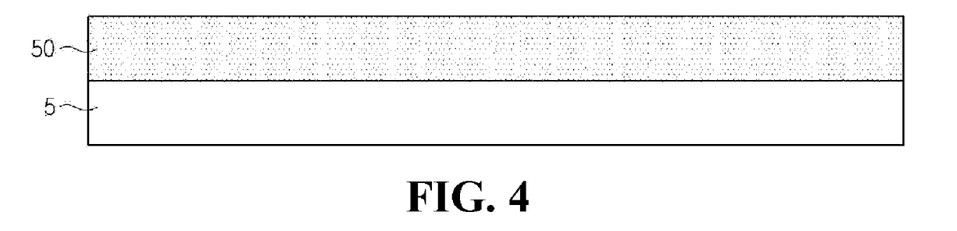

As illustrated in FIG. 4, second substrate 5 is prepared.

Second substrate 5 may be a single crystalline or polycrystalline silicon substrate doped with a p-type or n-type impurity. In some embodiments of the present invention, second substrate 5 may be a p-type substrate. First substrate 10 and second substrate 5 may be formed the same size. Also, second substrate 5 may further include an epitaxial layer formed thereon.

Photodiode 50 may be formed on or in second substrate 5. Photodiode 50 may include an n-type impurity region and a p-type impurity region. The n-type impurity region and the p-type impurity region may be formed to contact each other, thereby forming photodiode 50 having a PN junction.

Since photodiode 50 may be formed by implanting impurity ions into second substrate 5, a defect in photodiode 50 can be prevented or reduced to minimize generation of a dark current.

Figure 5:
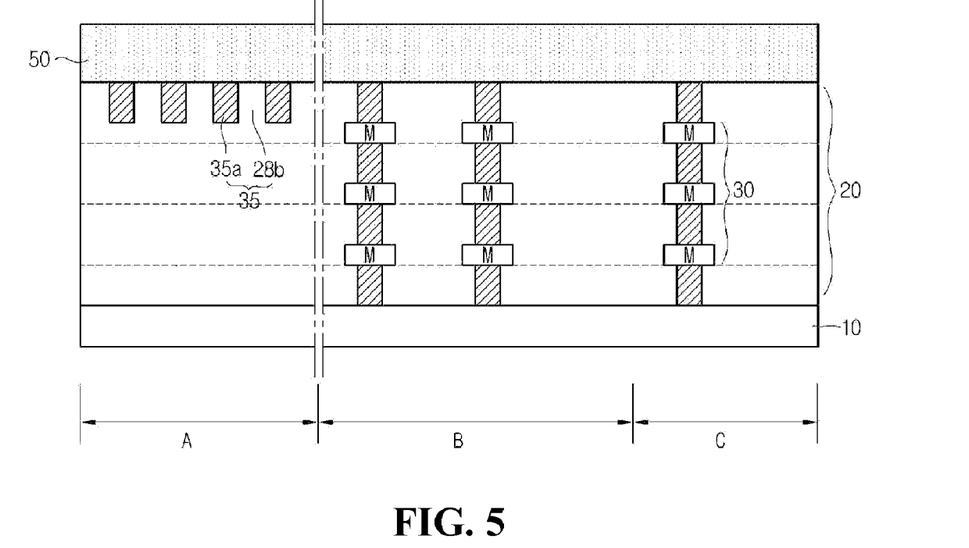

As illustrated in FIG. 5, photodiode 50 may be formed over interlayer dielectric 20 of first substrate 10 by bonding first substrate 10 and second substrate 5 to each other. In detail, second substrate 5 may be positioned over first substrate 10 such that photodiode 50 of second substrate 5 is adjacent to interlayer dielectric 20 of first substrate 10, and then second substrate 5 may be bonded to first substrate 10.

Photodiode 50 may be bonded in a region corresponding to the scribe lane (A). In some embodiments of the present invention, since protrusion 28b comprises an insulator at a center of align key 35, the bonding force of photodiode 50 to first substrate 10 can be further enhanced. That is, the bonding force between protrusion 28b made of insulator and photodiode 50 can be increased to prevent photodiode 50 from being detached from first substrate 10.

As first substrate 10 and second substrate 5 may be bonded to each other, the plug of metal interconnection 30 may be electrically connected to photodiode 50 of second substrate 5.

After that, second substrate 5 may be removed with photodiode 50 left over first substrate 10. Second substrate 5 may be removed such that only photodiode 50 is left over first substrate 10. For example, second substrate 5 may be removed by an etching or chemical mechanical polishing (CMP) process. Thus, since photodiode 50 may be positioned over first substrate 10, a vertical integration of photodiode 50 and first substrate 10 can be achieved.

Figure 6:
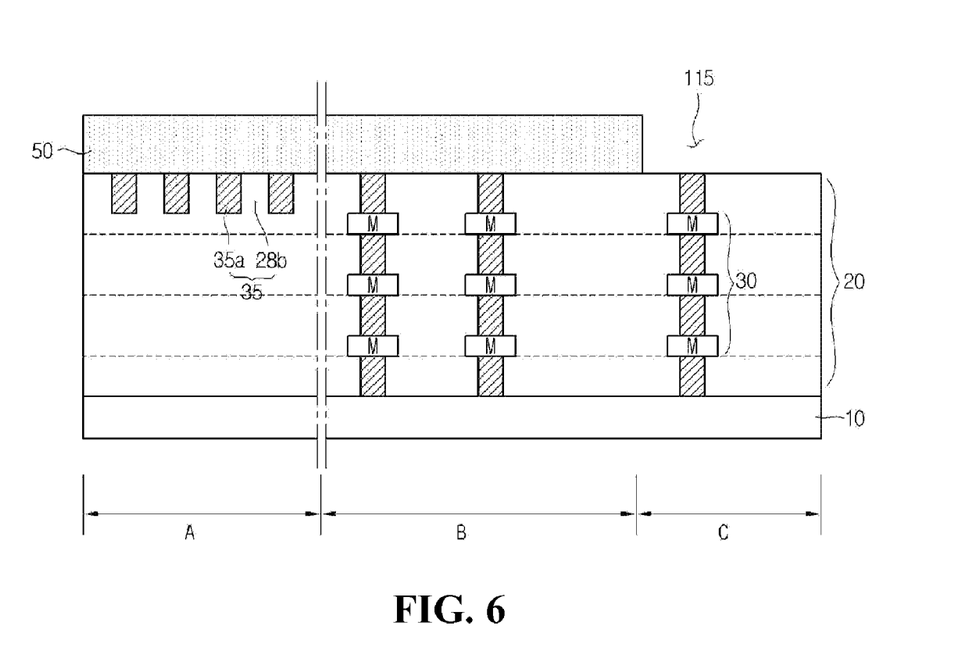

As illustrated in FIG. 6, photodiode 50 may be partially removed such that photodiode 50 is left on or over the scribe lane (A) and pixel region (B) of first substrate 10.

Specifically, some of photodiode 50 may be removed to form an opening 115 partially exposing interlayer dielectric 20 and metal interconnection 30 of the peripheral circuitry region (C). Opening 115 can expose metal interconnection 30 of the peripheral circuitry region (C) by removing a portion of photodiode 50 over the peripheral circuitry region (C). Accordingly, photodiode 50 may remain only over the scribe lane (A) and the pixel region (B) of first substrate 10.

Figure 7:
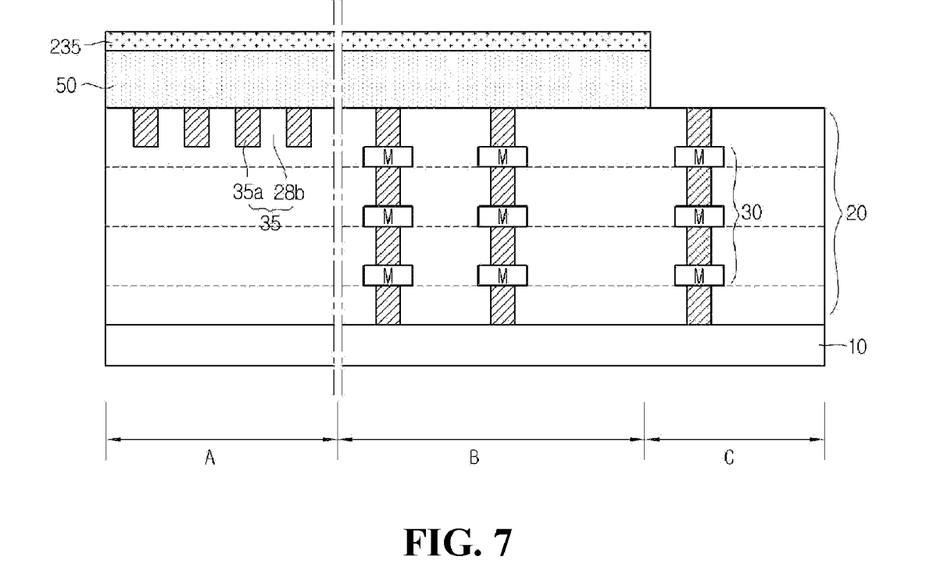

As illustrated in FIG. 7, transparent electrode 235 may be formed on and/or over photodiode 50. Transparent electrode 235 may be formed by forming a transparent electrode layer over first substrate 10 including photodiode 50 and then patterning the transparent electrode layer such that the transparent electrode layer is left only over photodiode 50. Transparent electrode layer 230 can be connected to photodiode 50.

Transparent electrode 235 may comprise a material having a high light transmittance and a high conductivity. For example, transparent electrode 235 may comprise any of the group consisting of indium tin oxide (ITO), cadmium tin oxide (CTO) and $ZnO_2$.

Figure 8:
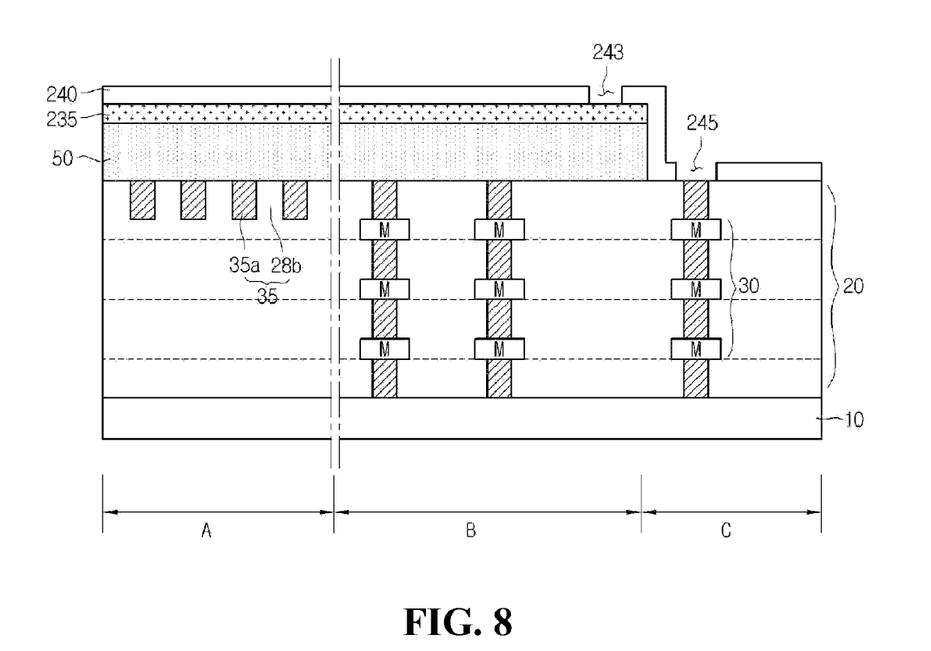

As illustrated in FIG. 8, first passivation layer 240 which may include first and second trenches 243 and 245 may be formed on and/or over first substrate 10 including transparent electrode 235. First passivation layer 240 may be formed on and/or over photodiode 50 and may extend to interlayer dielectric 20 and metal interconnection 30 of the peripheral circuitry region (C) to thereby protect and insulate photodiode 50.

First trench 243 formed in first passivation layer 240 can selectively expose a portion of transparent electrode 235. First trench 243 may be selectively formed to expose a portion of transparent electrode 235 such that the light receiving region of photodiode 50 formed under transparent electrode 235 is unaffected.

Second trench 245 can expose metal interconnection 30 of the peripheral circuitry region (C). First trench 243 and second trench 245 may be formed by forming first passivation layer 240 and patterning first passivation layer 240 through a photolithography and etching process.

As illustrated in FIG. 9, upper electrode 255, second passivation layer 260 and color filter 270 may be formed on and/or over first passivation layer 240 including first and second trenches 243 and 245.

Upper electrode 255 may be formed inside first trench 243 and may be electrically connected to transparent electrode 235. In particular, upper electrode 255 may be formed by forming an upper electrode layer on and/or over first passivation layer 240 including first and second trenches 243 and 245 and then removing a portion of upper electrode 255 corresponding to unit pixel. As a result, upper electrode 255 may be formed inside first trench 243 and may be electrically connected to transparent electrode 235. Also, upper electrode 255 may be formed inside second trench 245 and may be connected to metal interconnection 30. Upper electrode 255 may comprise a conductive material including Al, Cu, Ti, W and the like. Upper electrode 255 may be partially formed on and/or over a selected region of photodiode 50 such that upper electrode 255 does not affect the light receiving region of photodiode 50.

Next, second passivation layer 260 may be formed on and/or over first substrate 10 including first passivation layer 240 and upper electrode 255. Second passivation layer 260 may comprise nitride or oxide.

After that, color filter 270 may be formed on and/or over second passivation layer 260. Color filter 270 may be formed for each unit pixel, and may filter colors from incident light. Color filter 270 may include red (R), green (G) and blue (B) color filters. Although not shown in the drawings, a microlens may be further formed on and/or over color filter 270.

As described above, the method for manufacturing an image sensor in accordance with embodiments of the present invention can enhance the bonding force between first substrate 10 and photodiode 50 by forming the protrusion of insulator at a center of the align key on the scribe lane and forming the align pattern around the protrusion. Therefore, photodiode 50 can be prevented from being detached from first substrate 10.

Also, the method for manufacturing an image sensor in accordance with embodiments of the present invention can provide vertical integration of the image sensor by coupling photodiode 50 to first substrate 10 including metal interconnection 30 through a bonding process.

Further, the method for manufacturing an image sensor in accordance with embodiments of the present invention can enhance light receiving efficiency by forming photodiode 50 over first substrate 10 to decrease a focal length of photodiode 50.

Furthermore, the method for manufacturing an image sensor in accordance with embodiments of the present invention can increase the performance of the image sensor, miniaturize the image sensor, and save manufacturing costs by additively integrating on-chip circuitry.

Moreover, the method for manufacturing an image sensor in accordance with embodiments of the present invention can prevent or reduce generation of a defect in photodiode 50 by employing a vertical type photodiode and forming the vertical type photodiode in a crystalline semiconductor layer through an ion implantation.

Although embodiments of the present invention relate generally to a complementary metal oxide semiconductor (CMOS) image sensor, such embodiments are not limited to the same and may be readily applied to any image sensor requiring a photodiode.

Although various embodiments have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a first substrate including a pixel region, a peripheral circuitry region and a scribe lane;
   a dielectric including a metal interconnection over the pixel region and the peripheral circuitry region;
   an align key in the scribe lane, wherein the align key has a protrusion in a center thereof;
   a photodiode over the pixel region and the scribe lane; and
   a transparent electrode over the photodiode.

2. The image sensor of claim 1, wherein the photodiode is over and in contact with the align key.

3. The image sensor of claim 1, wherein the align key comprises a metallic align pattern and an insulator protrusion.

4. The image sensor of claim 3, wherein the insulator protrusion is formed in a center of the align pattern such that the metallic align pattern surrounds the insulator protrusion.

5. A method for manufacturing an image sensor comprising:
   preparing a first substrate including a pixel region, a peripheral circuitry region and a scribe lane;
   forming a dielectric including a metal interconnection over the pixel region and the peripheral circuitry region;
   forming an align key in the scribe lane, wherein the align key has a protrusion formed at a center thereof;
   forming a photodiode over the pixel region and the scribe lane such that the align key and the metal interconnection over the pixel region are connected to the photodiode; and
   forming a transparent electrode over the photodiode.

6. The method of claim 5, wherein forming the dielectric comprises:

forming a metal layer pattern in and/or on a first dielectric layer over the pixel region and the peripheral circuitry region;

forming a second dielectric layer including a via hole exposing the metal layer pattern and an align groove in the scribe lane; and filling the via hole and the align groove with a metal material.

7. The method of claim 6, wherein the protrusion is formed in a center of the align pattern such that the align pattern surrounds the protrusion.

8. The method of claim 5, wherein forming the photodiode comprises:

preparing a second substrate including the photodiode;
bonding the second substrate to the first substrate;
removing the second substrate such that the photodiode is left over the first substrate; and
removing the photodiode over the peripheral circuitry region.

9. The method of claim 5, wherein the photodiode is over and in contact with the align key.

10. The method of claim 5, wherein the metal interconnection comprises a metal layer pattern and a plug.

11. The method of claim 8, further comprising forming an opening that partially exposes the dielectric and the metal interconnection over the peripheral circuitry region.

12. The image sensor of claim 1, wherein the transparent electrode comprises a material having a high light transmittance and a high conductivity.

13. The image sensor of claim 1, further comprising a first passivation layer over the photodiode and the transparent electrode, wherein the first passivation layer includes first and second trenches.

14. The image sensor of claim 13, wherein the first trench of the first passivation layer selectively exposes a portion of the transparent electrode and the second trench of the first passivation layer exposes the metal interconnection over the peripheral circuitry region.

15. The image sensor of claim 13, further comprising an upper electrode, a second passivation layer, and a color filter over the first passivation layer.

16. The image sensor of claim 15, wherein the upper electrode is formed inside the first and second trenches of the first passivation layer, and the upper electrode inside the first trench is electrically connected to the transparent electrode.

17. The method of claim 5, further comprising forming a first passivation layer over the photodiode and the transparent electrode, wherein the first passivation layer includes first and second trenches.

18. The method of claim 17, wherein the first trench of the first passivation layer selectively exposes a portion of the transparent electrode and the second trench of the first passivation layer exposes the metal interconnection over the peripheral circuitry region.

19. The method of claim 17, further comprising forming an upper electrode, a second passivation layer, and a color filter over the first passivation layer.

20. The method of claim 19, wherein the upper electrode is formed inside the first and second trenches of the first passivation layer, and the upper electrode inside the first trench is electrically connected to the transparent electrode.

* * * * *